(12) United States Patent
Huang

(10) Patent No.: US 9,337,371 B2
(45) Date of Patent: May 10, 2016

(54) CAM TURNTABLE, SUN-TRACKING DEVICE EQUIPPED WITH SAME AND CONTROL METHOD FOR THE DEVICE

(75) Inventor: Zhong Huang, Chengdu (CN)

(73) Assignee: CHENGDU ZSUN SCIENCE AND TECHNOLOGY DEVELOPING CO., LTD., Chengdu (CN)

( * ) Notice: Subject to any disclaimer, the term of this patent is extended or adjusted under 35 U.S.C. 154(b) by 381 days.

(21) Appl. No.: 13/582,801

(22) PCT Filed: Aug. 16, 2011

(86) PCT No.: PCT/CN2011/078501
§ 371 (c)(1),
(2), (4) Date: Sep. 5, 2012

(87) PCT Pub. No.: WO2012/022257
PCT Pub. Date: Feb. 23, 2012

(65) Prior Publication Data
US 2013/0133719 A1 May 30, 2013

(30) Foreign Application Priority Data

Aug. 16, 2010 (CN) .......................... 2010 1 0254301

(51) Int. Cl.
*H01L 31/042* (2014.01)
*H02N 6/00* (2006.01)
*H01L 31/052* (2014.01)
*F24J 2/54* (2006.01)
*F16H 1/16* (2006.01)

(52) U.S. Cl.
CPC .............. *H01L 31/052* (2013.01); *F24J 2/542* (2013.01); *H02S 20/00* (2013.01); *F16H 1/16* (2013.01); *F24J 2002/5437* (2013.01); *F24J 2002/5448* (2013.01); *Y02E 10/47* (2013.01); *Y02E 10/50* (2013.01)

(58) Field of Classification Search
CPC .................. F24J 2002/5437; F24J 2002/5448; F16H 1/16; Y02E 10/47
USPC .......................................................... 136/246
See application file for complete search history.

(56) References Cited

U.S. PATENT DOCUMENTS

2013/0240018 A1* 9/2013 Park et al. ..................... 136/246

FOREIGN PATENT DOCUMENTS

| CN | 2736705 Y | 10/2005 |
|---|---|---|
| CN | 2882108 Y | 3/2007 |

(Continued)

*Primary Examiner* — Shannon Gardner
(74) *Attorney, Agent, or Firm* — Novick, Kim & Lee, PLLC; Allen Xue

(57) ABSTRACT

Provided are a cam turntable (2), a sun-tracking device equipped with the cam turntable (2) and a control method for the device. The sun-tracking device comprises a support mechanism for mounting a photovoltaic assembly (1), and an azimuth driving device, which is a cam turntable (2), fixed on the support mechanism for adjusting the azimuth thereof. The sun-tracking device adjusts the azimuth of the support mechanism for mounting the photovoltaic assembly (1) by utilizing the cam turntable (2) as the azimuth driving device, so that harmful incoming impact loads on the sun-tracking device as a whole are transferred into friction forces which are then transferred and alleviated, therefore it is advantageous in avoiding damages to subsequent driving devices due to the excessively large impact loads, especially in protecting the precision of a control worm gear (2-12) from being affected, which in turn extends the service life of the sun-tracking device as a whole. The device has high safety, large load capacity, and the function of automatic gap adjustment.

7 Claims, 5 Drawing Sheets

(56) References Cited

FOREIGN PATENT DOCUMENTS

| CN | 201051504 Y | 4/2008 |
| CN | 201207625 Y | 3/2009 |
| CN | 201213244 Y | 3/2009 |
| CN | 201232734 Y | 5/2009 |
| CN | 201682438 U | 12/2010 |
| KR | 10-2009-0008504 A | 1/2009 |

* cited by examiner

CAM TURNTABLE, SUN-TRACKING DEVICE EQUIPPED WITH SAME AND CONTROL METHOD FOR THE DEVICE

FIELD OF TECHNOLOGY

Current invention is related to the technology of focusing solar power for photovoltaic power generation, specifically relates to a cam turntable, a sun-tracking device equipped with the cam turntable and a control method for controlling the device.

BACKGROUND

Following economic development and social evolution, the consumption and exploitation of natural resources is so aggressive that such consumption and exploitation is almost predatory. Natural resources are almost exhausted by human exploitation and large amount of natural resources are polluted during exploitation making the situation facing humanity extremely devastating. The level of human consumption of natural resources is rising higher and higher, as result, searching for new energy is a pressing issue facing humanity. Solar energy is a renewable energy source that is clean, environmentally friendly and virtually without limit. Sustainable development of economy favors solar energy, and among many different utilizations of solar energy, transforming solar energy into electricity is a major one. The technology of focusing solar power for photovoltaic power generation is to transform focused solar energy into electric energy.

Fixed photovoltaic module for solar power generation is the main stream form for solar power generation, in which photovoltaic modules are fixed on support mechanism, solar radiation is collected from sunrise to sunset, collected solar energy is transformed into electric energy, the amount of electric energy transformed is proportional to the effective radiation area of the photovoltaic module, while the effective radiation area is defined as the projection area on the surface of the photovoltaic module when the sun beam is perpendicular to the surface of the photovoltaic module. The earth's rotation causes the sun to rise and set every day, there is only a very short period of time when the sun beam is practically perpendicular to the surface of the photovoltaic module, when the sun beam is tilted, the effective radiation area is the full surface area of the photovoltaic module times cosine of the angle between the surface of the photovoltaic module and the sun beam, as a result, the solar energy collection efficiency is relatively low, large amount of solar radiation is wasted.

In order to resolve above problems, azimuth driving device is utilized to achieve sun-tracking by controlling the azimuth of the photovoltaic module, in which the photovoltaic module tracks trajectory of the sun to maximize the amount of time when the sun beam is perpendicular to the surface of the photovoltaic module, so that solar transform efficiency is maximized. In current market, bearing turntable is widely used as the driving device to control azimuth motion, in which the bearing turntable holds photovoltaic module on the support mechanism, sun-tracking is achieved through controlling the bearing turntable that holds photovoltaic module. A problem with such bearing turntable is its lack of protection against wind overload, strong wind causes harmful incoming an impact load on the bearing turntable, and such harmful incoming impact load damages bearing turntable and reduces the service life of the sun-tracking device. In addition, after a period of time in deployment, wearing between moving components of the bearing turntable creates gaps between components, such gaps can only be fixed manually by skilled workers, as a result, the maintenance cost for such large scale sun-tracking system is very high which prevents large scale commercial deployment.

SUMMARY

In order to resolve the above problems, the current invention provides a cam turntable, which is capable of not only resisting large incoming impact loads, but also automatically adjusting the gaps in azimuth driving device, a sun-tracking device equipped with the cam turntable and a control method for the sun-tracking device.

The current invention resolves above mentioned technical problems through the following:

A cam turntable, which is characterized by: the cam turntable comprising a shell, a driving equipment affixed on the shell, a power output axis with a cam driven by the driving equipment, and a control equipment on the power output axis implemented to eliminate external incoming impact loads.

The cam turntable disclosed in the current invention, in which, the driving equipment of the cam turntable comprises: an electric driving motor located on the shell, a driving screw on the power output end of the electric driving motor, and a driving worm meshed with the driving screw fixed and located on the power output axis, a sequence of power transfer is electric motor→driving screw→driving worm→power output axis.

The cam turntable disclosed in the current invention, in which, the control equipment of the cam turntable comprises: an electric driving motor located on the shell, a driving screw on the power output end of the electric driving motor, a driving worm meshed with the driving screw mounted on the power output axis through a sliding sleeve; and a friction device touching the cam surface, in which, the driving worm is located between the cam and the driving screw, the driving worm and driving screw are separated by the sliding sleeve which is set on the power output axis and is parallel to the power output axis to fix the distance between the driving screw and the driving worm to avoid relative motion between them, and to better eliminate external incoming impact load.

The cam turntable disclosed in the current invention, in which, the friction equipment of the cam turntable comprises: a friction body affixed on the shell and touching the surface of the cam and a friction plate disposed between the cam and the friction body, in which the friction plate engages both the friction body and the cam to achieve surface contact between the friction plate and the friction body, and between the friction plate and the cam, as a result, to better convert an external incoming impact load into a friction force, so that to better alleviate the harmful external incoming impact load.

The cam turntable disclosed in the current invention, in which, the cam of the cam turntable is heart-shaped, in which the friction plate engages the depression surface of heart-shaped cam, the geometry of the depression surface of the heart-shaped cam can be designed according to practical considerations.

The cam turntable disclosed in the current invention, in which, a tapered roller bearing is preferred, in an embodiment of the cam turntable, to be fitted between the power output axis and the friction plate of the cam turntable, other forms of bearings can be adapted according to other detailed considerations.

The cam turntable disclosed in the current invention, in which, one end of the power output axis of the cam turntable is located inside the shell, the other end of the power output axis extends outside the shell; at the same time, in order to adjust the gaps between internal components of the cam turntable during assembly, an end cover is located on the end of the shell where the power output axis does not extend outside the shell, the end cover is fixed onto the shell through screws, adjustment of the gaps is thus achieved; on the other end, a sealing ring is fitted between the power output axis and the friction body, the sealing ring seals the tapered roller bearing between the power output axis and friction body.

The cam turntable disclosed in the current invention, in which, in order to pre-tight and seal the components inside the cam turntable during assembly, O-shaped sealing rings are fitted between the friction body and the shell, and between the end cover and the shell.

The cam turntable disclosed in the current invention, in which, the friction body of the cam turntable is affixed on the shell by screws for the convenience of assembly and disassembly of the friction body, thus for the convenience of repair and replacement.

A sun-tracking device, comprises: a support mechanism for supporting photovoltaic module, an azimuth driving device affixed on the support mechanism, which is adapted to adjust azimuth of the support mechanism, in which the azimuth driving device is the cam turntable.

The sun-tracking device disclosed in the current invention, in which, the support mechanism of the sun-tracking device comprising a standing pole, a holding arm and a frame system, the lower end of the holding arm being connected to the standing pole through the cam turntable, the upper end of the holding arm being connected to the supporting system, and the photovoltaic module being installed on the supporting system.

The sun-tracking device disclosed in the current invention, in which, the end of the power output axis that extends outside the shell of the cam turntable of the sun-tracking device is connected to the lower end of the holding arm.

The sun-tracking device disclosed in the current invention, in which, in order to transform maximally possible amount of harmful external incoming impact load into friction force, the end of the power output axis of the cam turntable that extends out of the shell is rigidly connected to the lower end of the holding arm through an output flange.

The sun-tracking device disclosed in the current invention, further comprises an elevation driving device to adjust the elevation of the support mechanism, the elevation driving device is located between the holding arm and the support mechanism, the elevation driving device and the azimuth driving device (aka, the cam turntable) complement each other to achieve full-fitting tracking of the trajectory of solar movement for the photovoltaic component support mechanism of the sun-tracking device, so that to maximize the usage of sun light and to improve the utilization efficiency of solar energy.

A method for controlling the sun-tracking device, which is characterized by, comprising the steps of:

a) first starting the driving electric motor, then starting the control electric motor, and setting the speed of the control electric motor to lower than 10% of the speed of the driving electric motor;

b) the control electric motor driving the rotation of the friction plate through the control screw and the control worm, and moving in the same direction as the driving electric motor, further releasing the torque produced by the driving electric motor;

c) stopping the driving electric motor after a brief delay, because the cam and the power output axis are a whole piece, and the starting time of the control electric motor is slightly later than the driving electric motor, that is, a delay and a speed difference exist between the two electric motors when being started, so when the external incoming impact load being relatively large, the incoming impact load acting on the friction plate through the cam, and transferring into friction force between the friction plate and the friction body, so that such harmful external incoming impact load being effectively shifted and eliminated.

The method for controlling the sun-tracking device, in which, in step b), the control worm restricting only the circular motion of the friction plate, not restricting the radial motion.

The method for controlling the sun-tracking device, in which, the control worm acting through the cam, the cam squeezing the friction plate toward the friction body, so that removing the gaps between the components of the cam turntable which are generated during assembly or generated from component wearing after a period of usage.

The current invention possesses the following benefits:

a) Compared to existing sun-tracking devices, the current invention provides a sun-tracking device which uses cam turntable as the azimuth driving devise to adjust azimuth of the support mechanism which holds the photovoltaic modules, though the control device, the cam turntable transfers harmful external incoming impact load exerted on the sun-tracking device into friction force to shift and eliminate harmful incoming impact loads, to protect the subsequent driving device from damages caused by excessive incoming impact loads, in particular to protect the precision of the driving worm, in addition, it further prolongs the service life of the whole sun-tracking device, it has a high safety level and large load level.

b) In the above mentioned sun-tracking device, the cam turntable, in addition to being the azimuth driving device, possesses automatic gap adjustment function, that is, because of the delay in starting time and the speed difference between the control worm and the control screw, the control worm acts through the cam, the cam squeezes the friction plate toward the friction body, so that it removes the gaps between the components of the cam turntable which are generated during assembly or generated from component wearing after a period of usage, thus it saves maintenance cost to remove those gaps manually, it makes the structure compact and safe to use.

c) The cam turntable uses heart-shaped cam, in which the friction plate engages the depression surface of heart-shaped cam, at the same time, surface contact is implemented between the cam and the friction plate, and between the friction plate and the friction body, so that the contact areas between them are maximized, and to effectively transfer harmful external incoming impact loads into friction force to shift and eliminate the harmful external incoming impact load. The depression surface of the heart-shaped cam can be designed ad hoc according to practical considerations such as the amount of incoming impact load that needs to be shifted and eliminated; it is simple-structured, economic and practical. As to the cam turntable itself, it can be widely used in large rotating machineries such as hoisting and conveying machinery, mining machinery, construction machinery, port machinery and sun-tracking machinery, it is suitable for marketing.

d) In addition to the cam turntable used as the azimuth driving device for the sun-tracking system to track the trajectory of the solar movement, an elevation angle driving device is located between the holding arm and the frame system to adjust the elevation angle of the frame system, the elevation driving device and the azimuth driving device (the cam turntable) work together, to enable the full-fitting tracking of the trajectory of the solar movement for the support mechanism of the photovoltaic module of the sun-tracking device, to maximize the collection of solar radiation from sun rise to sun set, greatly improving solar utilization efficiency.

In the above mentioned figures, 1 is photovoltaic component; 2 is cam turntable; 2-1 is shell; 2-2 is cam; 2-3 is power output axis; 2-4 is driving electric motor; 2-5 is driving screw; 2-6 is driving worm; 2-7 is driving electric motor; 2-8 is control screw; 2-9 is sliding sleeve; 2-10 is control worm; 2-11 is separation sleeve; 2-12 is friction body; 2-13 is friction plate; 2-14 is depression surface of the cam 2-2; 3 is standing pole; 4 is holding arm; 5 is support mechanism; 6 is end cover; 7 is axis sealing ring; 8 is output flange; 9 is elevation driving device; 10 is screw; 11 is tampered roller bearing; 12 is bolt; 13 is O-shaped sealing ring.

DETAILED DESCRIPTION

To better illustrate the goals, technical solutions and the advantages of the current invention, detailed descriptions of the invention is provided in combination with figures and embodiments. It should be understood that the examples and embodiments described here are for illustration purpose only, and are not meant to limit the scope of the current invention.

Figure 1:
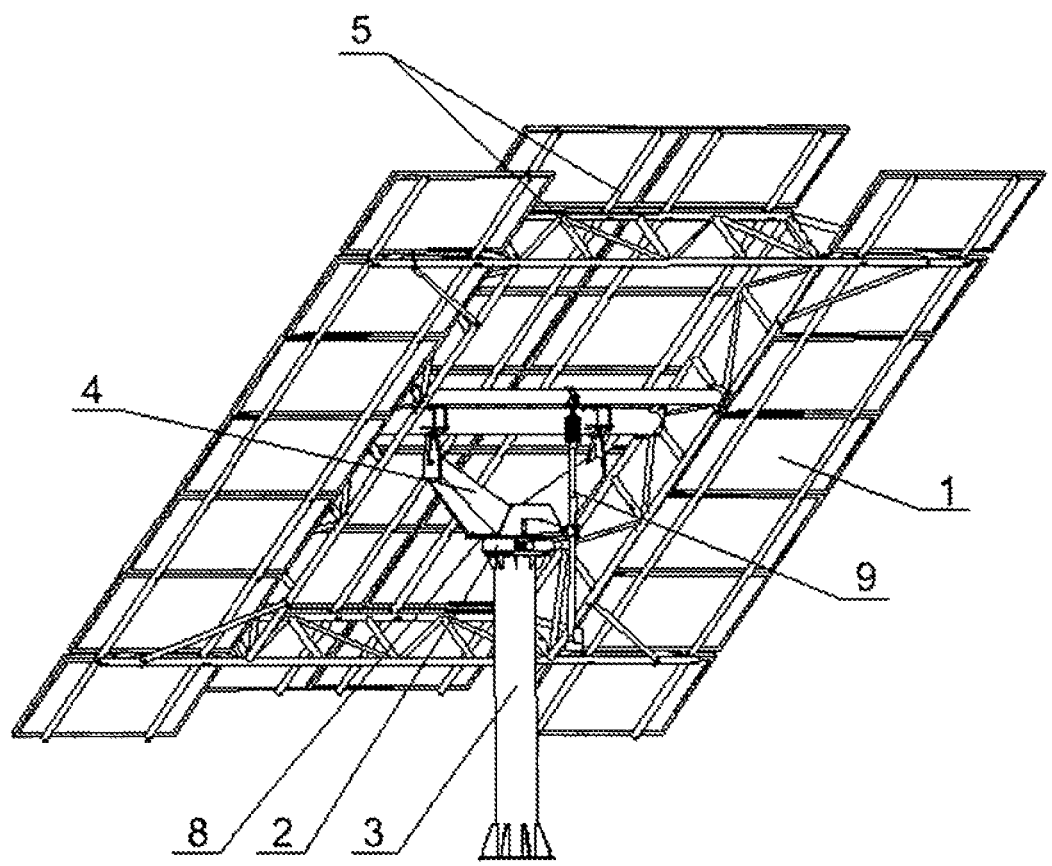
FIG. 1, the structure of an embodiment of the sun-tracking device.
Figure 2:
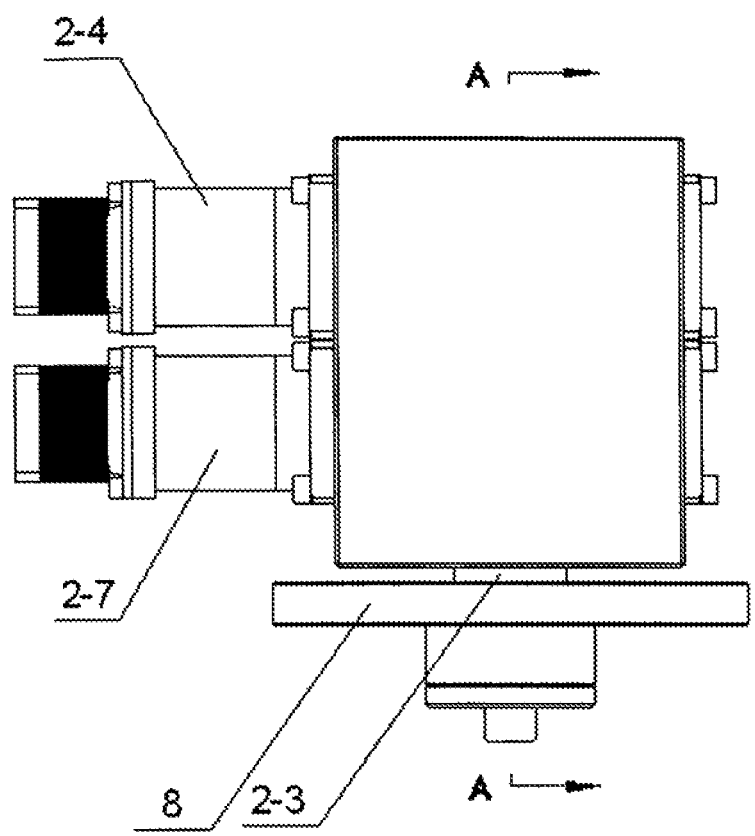
FIG. 2, the main view of the cam turntable in FIG. 1.
Figure 3:
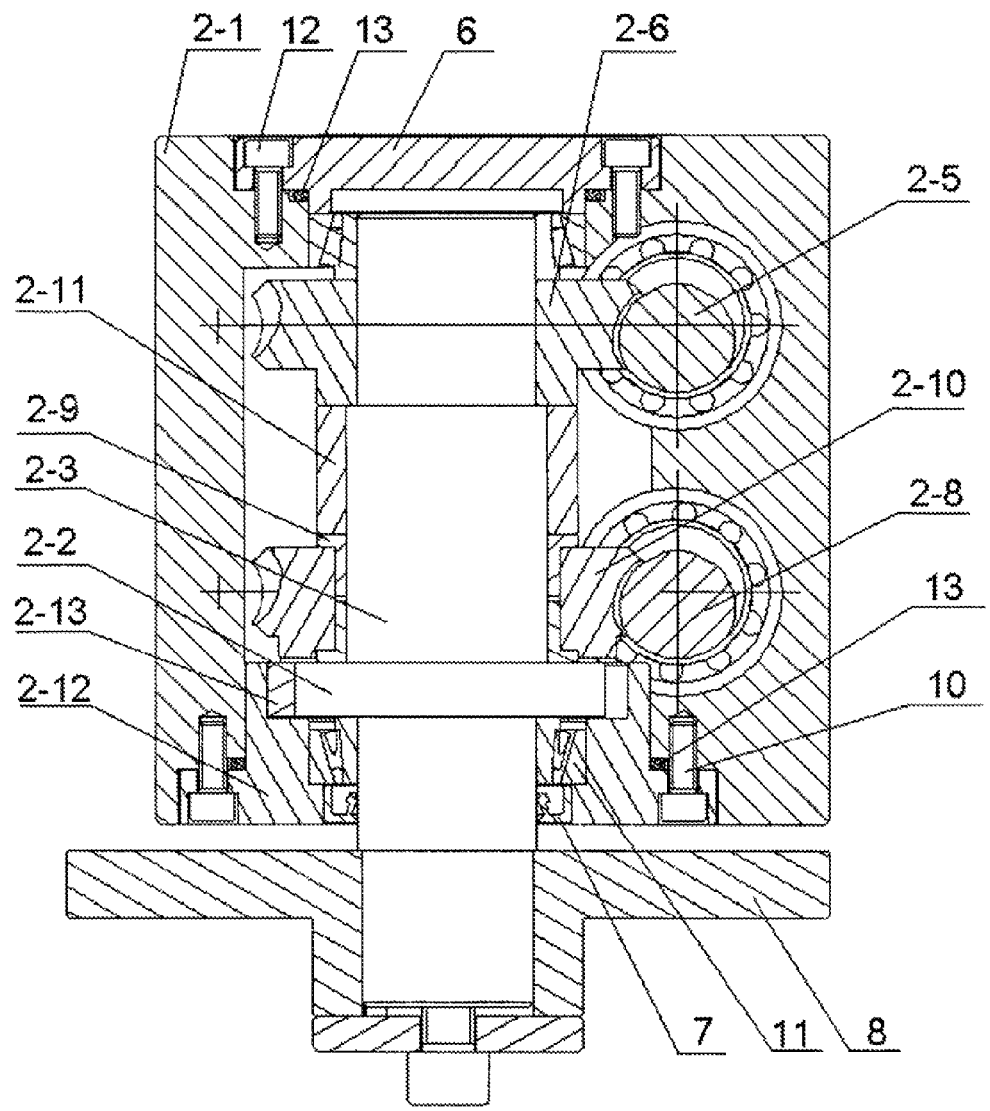
FIG. 3, the A-A cross sectional view of FIG. 2.
Figure 4:
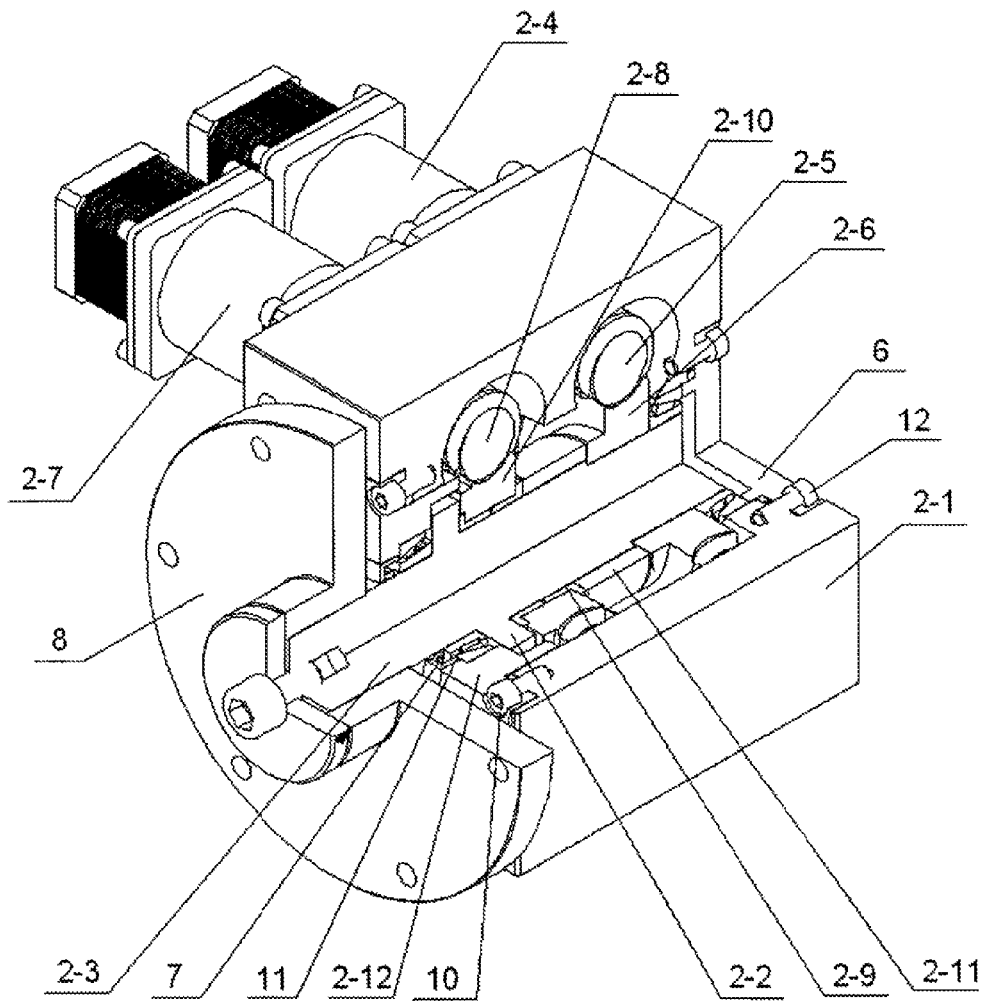
FIG. 4, the three-dimensional view of the interior of the cam turntable in FIG. 2.
Figure 5:
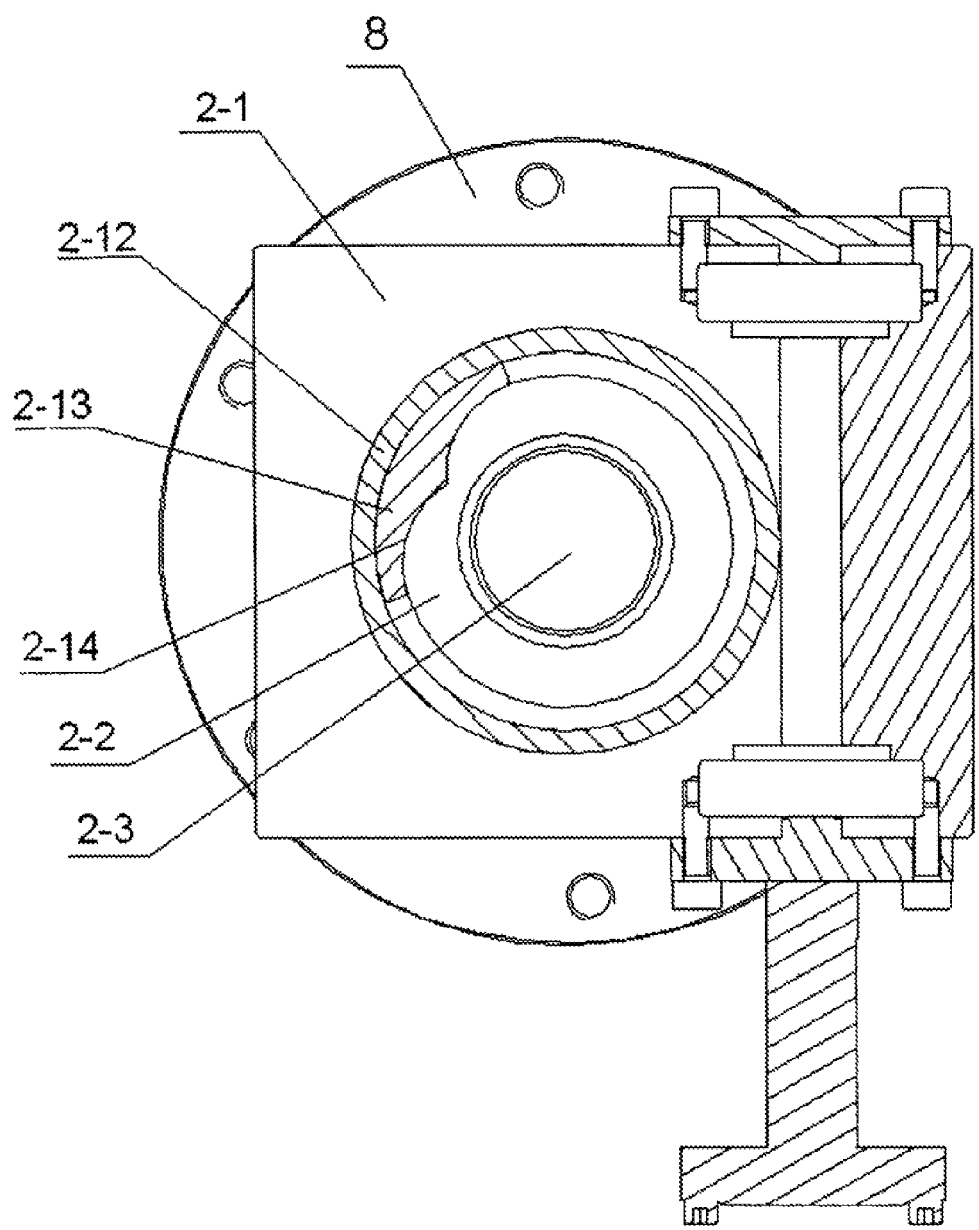
FIG. 5, illustration of the structure of the cam of the cam turntable touching the friction device in one embodiment.

In FIGS. 1~5, a sun-tracking device, comprises a support mechanism implemented for the photovoltaic component 1 to be installed on, and an azimuth driving device installed on the support mechanism to adjust the azimuth of the support mechanism, the azimuth driving device is cam turntable 2.

The cam turntable 2 comprises a shell 2-1, a driving device installed on the shell 2-1, a power output axis 2-3 driven by the driving device and equipped with a cam 2-2, and a control device located on the power output axis 2-3 implemented to shift external incoming impact loads.

The driving device comprises a driving electric motor 2-4 (in one embodiment, the driving electric motor 2-4 is a constant torque electric motor) installed on the shell 2-1, a driving screw 2-5 connected on the output end of the driving electric motor 2-4, and a driving worm 2-6 installed on the power output axis 2-3 and engages the driving screw 2-5.

The driving device comprises a control electric motor 2-7 located on the shell 2-1, a control screw 2-8 connected on the power output end of the control electric motor 2-7, a control worm 2-10 installed on the power output axis 2-3 through sliding sleeve 2-9 and meshed to the control screw 2-8, and a friction device surface-touching the cam 2-2, the control worm 2-10 is located in between the cam 2-2 and the driving worm 2-6, and a sleeve 2-11 set parallel on the power output axis 2-3 separating the control worm 2-10 and the driving worm 2-6.

The friction device comprises friction body 2-12 surface-touching the cam 2-2 and affixed on the shell 2-1, and a friction plate 2-13 located in between the cam 2-2 and the friction body 2-12, the friction plate 2-13 fitting both the friction body 2-12 and the cam 2-2; the friction body 2-12 being fixed on the shell 2-1 through screw 10; the cam 2-2 being heart-shaped, the friction plate 2-13 fitting the depression surface 2-14 of the heart-shaped cam 2-2; a tampered roller bearing 11 is located in between the power output axis 2-3 and the friction body 2-12.

The support mechanism comprises a standing pole 3, a holding arm 4 and support system 5, the lower end of the holding arm 4 being connected to the standing pole 3 through the cam turntable 2, the upper end of the holding arm 4 being connected to the support mechanism 5, the photovoltaic component 1 being installed on the support mechanism 5; one end of the power output axis 2-3 being located inside the shell 2-1, the other end extending out of the shell 2-1 and connecting to the lower end of the holding arm 4; and the end of the shell 2-1 that the power output axis 2-3 that does not extend outside the shell having an end cover 6, the end cover 6 being fixed on the shell 2-1 through bolt 12; a sealing ring 7 being located between the other end of the power output axis 2-3 and the friction body 2-12, the sealing ring 7 sealing the tampered roller bearing 11 in between the power output axis 2-3 and the friction body 2-12; the end of the power output axis 2-3 that extends outside the shell being rigid-connected to the lower end of the holding arm 4 through output flange; O-shaped sealing ring 13 being located between the friction body 2-12 and the shell 2-1, between the end cover 6 and the shell 2-1.

The sun-tracking device further comprises an elevation driving device 9 located between the holding arm 4 and the support mechanism 5, implemented to adjust elevation angle.

The method for controlling the sun-tracking device comprises the steps of, first starting the driving electric motor 2-4, then starting the control electric motor 2-7, and setting the speed of the control electric motor 2-7 lower than 10% of the speed of the driving electric motor 2-4, the control electric motor 2-7 driving the rotation of the friction plate 2-13 through control screw 2-8 and control worm 2-10 (the control worm 2-10 restricting only the circular motion of the friction plate 2-13, not the radial motion), and the control electric motor 2-7 moving in the same direction as driving electric motor 2-4, so that the torque produced by the driving electric motor 2-4 being further released, stopping the driving electric motor 2-4 after a brief delay; because the cam 2-2 and the power output axis 3 is a whole piece, and the starting time of the control electric motor 2-7 is slightly delayed relative to the starting time of the driving electric motor 2-4, that is, there is delay and speed difference between the two electric motors, so when there is a large external incoming impact load, the incoming impact load acts on the friction plate 2-13 through the cam 2-2, and transfers into friction force between the friction plate 2-13 and the friction body 2-12, thus effectively shifting and eliminating the harmful external incoming impact load, and effectively protecting the accuracy of the control worm 10; the amount of incoming impact load that needs to be shifted and eliminated can be controlled by the design of the depression surface 2-14 of the cam 2-2; during the above operation, the control worm 2-10 acts through the cam 2-2, the cam 2-2 squeeze the friction plate 2-13 towards the friction body 2-12, so that removes the gaps between components of the cam turntable 2 caused during assembly or caused by wearing during operation.

In addition to implementing the cam turntable 2 as the azimuth driving device for the sun-tracking device, the sun-tracking device further comprises a elevation driving device 9 located in between the holding arm 4 and the support mechanism 5 to adjust the elevation angle of the support mechanism 5 (in the current embodiment, a motorized fader is implemented as elevation driving device 9), when the azimuth of the support mechanism 5 is adjusted by the cam turntable 2, the elevation angle driving device 9 adjusts the elevation angle of the support mechanism 5 at the same time, so that full fitting trajectory tracking of the solar movement is achieved for the photovoltaic component 1 installed on the support mechanism 5.

The above embodiment of the current invention is for illustration purpose only, it is not meant to limit the scope of the current invention, any modification, equivalent replacement or improvement etc. should be considered within the scope of protection of the current invention.

The invention claimed is:

1. A sun-tracking device, comprising:
a photovoltaic component;
a support mechanism that holds the photovoltaic component; and
an azimuth driving device affixed to the support mechanism and adjusts the azimuth,
   wherein the azimuth driving device is a cam turntable, the cam turntable comprises a shell, a driving device affixed to the shell, a power output axis attached to the cam and driven by the driving device, and a control device disposed on the power output axis,
   wherein the driving device further comprises a driving electric motor disposed on the shell, a driving screw connected to the power output end of the driving electric motor, and a driving worm affixed to the power output axis and meshed with the driving screw,
   wherein the control device further comprises a control electric motor disposed on the shell, a control screw connected to the power output end of the control electric motor, a control worm installed on the power output axis through a sliding sleeve and meshed with the control screw, and a friction device surface-touching the cam, wherein the control worm and the driving worm are separated by a sleeve disposed on the power output axis,
   wherein the friction device further comprises a friction body affixed to the shell and surface-touching the cam, and a friction plate disposed between the cam and the friction body,
   wherein the cam has a depression on its surface and the friction plate engages the depression surface,
   wherein the cam turntable further comprises a tampered roller bearing disposed between the power output axis and the friction body, and an end cover in proximity with a second end of the power output axis located inside the shell, and an axis sealing ring disposed between the power output axis and the friction body, wherein the axis sealing ring seals the tampered roller bearing.

2. The sun-tracking device in claim 1, wherein the support mechanism further comprises a standing pole, a holding arm, and a frame system, a lower end of the holding arm being connected to the standing pole through the cam turntable, a upper end of the holding arm being connected to the frame system, and the photovoltaic component installed on the frame system.

3. The sun-tracking device in claim 2, wherein a first end of the power output axis of the cam turntable extends out of the shell, and the first end is connected to the lower end of the holding arm.

4. The sun-tracking device in claim 3, wherein the first end of the power output axis is rigidly connected to the lower end of the holding arm through an output flange.

5. The sun-tracking device in claim 4, further comprises an elevation angle driving device disposed between the holding arm and the frame system and adjusts the elevation angle of the frame system.

6. The sun-tracking device in claim 1, wherein the cam turntable further comprises a first O-shaped sealing ring disposed between the friction body and the shell, and a second O-shaped sealing ring disposed between the end cover and the shell.

7. The sun-tracking device in claim 6, wherein the friction body is affixed to the shell by a bolt.

* * * * *